US012593401B2

(12) United States Patent
Sano et al.

(10) Patent No.:  US 12,593,401 B2
(45) Date of Patent:  Mar. 31, 2026

(54) ELECTRONIC DEVICE

(71) Applicant: Magnolia White Corporation, Tokyo (JP)

(72) Inventors: Takumi Sano, Tokyo (JP); Akio Murayama, Tokyo (JP); Shinichiro Oka, Tokyo (JP); Masatomo Hishinuma, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 241 days.

(21) Appl. No.: 18/483,542

(22) Filed: Oct. 10, 2023

(65) Prior Publication Data

US 2024/0147615 A1      May 2, 2024

(30) Foreign Application Priority Data

Oct. 27, 2022    (JP) ................................. 2022-172445

(51) Int. Cl.
    *H05K 1/03*         (2006.01)
    *H05K 1/11*         (2006.01)
    *H05K 3/10*         (2006.01)
(52) U.S. Cl.
    CPC ........... *H05K 1/032* (2013.01); *H05K 1/0306* (2013.01); *H05K 1/118* (2013.01); *H05K 3/103* (2013.01); *H05K 2201/10106* (2013.01); *H05K 2201/10151* (2013.01)
(58) Field of Classification Search
    CPC ...... H05K 1/032; H05K 1/0306; H05K 1/118;

H05K 1/0287; H05K 1/0283; H05K 1/0277; H05K 1/028; H05K 2201/10106; H05K 2201/10151; H05K 2201/09263
See application file for complete search history.

(56)      References Cited

U.S. PATENT DOCUMENTS

| | | | |
|---|---|---|---|
| 2015/0282294 A1 | 10/2015 | Wakuda et al. | |
| 2015/0282296 A1 | 10/2015 | Ogura et al. | |
| 2016/0358849 A1* | 12/2016 | Jur ......................... | H10N 10/10 |
| 2017/0181276 A1 | 6/2017 | Sawada et al. | |
| 2018/0046221 A1* | 2/2018 | Choi ...................... | H05B 33/22 |
| 2019/0280077 A1* | 9/2019 | Park .................... | H10K 77/111 |

FOREIGN PATENT DOCUMENTS

| | | |
|---|---|---|
| JP | 2015-198101 A | 11/2015 |
| JP | 2015-198102 A | 11/2015 |
| JP | 2017-113088 A | 6/2017 |
| JP | 2017-118109 A | 6/2017 |

* cited by examiner

*Primary Examiner* — Roshn K Varghese
(74) *Attorney, Agent, or Firm* — XSENSUS LLP

(57)      ABSTRACT

According to one embodiment, an electronic device includes an elastic insulating base including a plurality of island-shaped portions and a plurality of strip-like portions each connecting respective adjacent pair of the plurality of island-shaped portions, electrical element located on each of the plurality of island-shaped portions and a plurality of wiring lines located in the plurality of strip-like portions respectively and each electrically connected to the electrical element. Each of the plurality of strip-like portions including a curved portion, and a ratio (R/W) of a radius (R) of curvature in the curved portions to the width W in the curved portion is in a range of $10 \leq R/W \leq 20$.

3 Claims, 4 Drawing Sheets

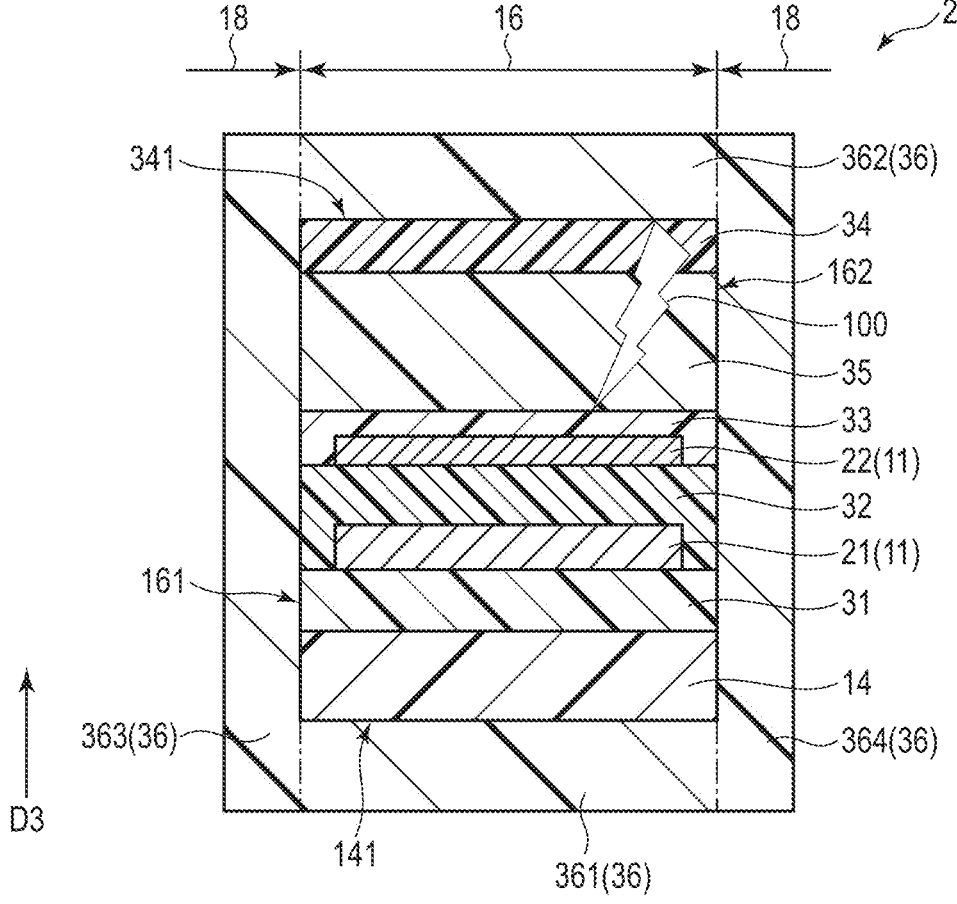
F I G. 3

ELECTRONIC DEVICE

CROSS-REFERENCE TO RELATED APPLICATIONS

This application is based upon and claims the benefit of priority from Japanese Patent Application No. 2022-172445, filed Oct. 27, 2022, the entire contents of which are incorporated herein by reference.

FIELD

Embodiments described herein relate generally to an electronic device.

BACKGROUND

In recent years, the use of flexible substrates with pliability and elasticity has been discussed in various fields. To cite one example, such use mode can be considered that a flexible substrate on which electrical elements are arrayed in a matrix shape is attached to curved surfaces such as the housing of an electronic device or the human body. As the electrical elements, for example, various sensors such as touch sensors and temperature sensors, and display elements can be applied.

In flexible substrates, it is necessary to take measures to prevent the wiring lines from breaking due to stress caused by bending or stretching. As such measures, for example, it has been proposed to provide honeycomb-shaped apertures in the base material that supports the wiring line or to make the wiring lines to wind their ways (meander shape).

BRIEF DESCRIPTION OF THE DRAWINGS

FIG. 3 is a schematic cross-sectional view of a hinge portion taken along line III-III in FIG. 2.

DETAILED DESCRIPTION

Figure 1:
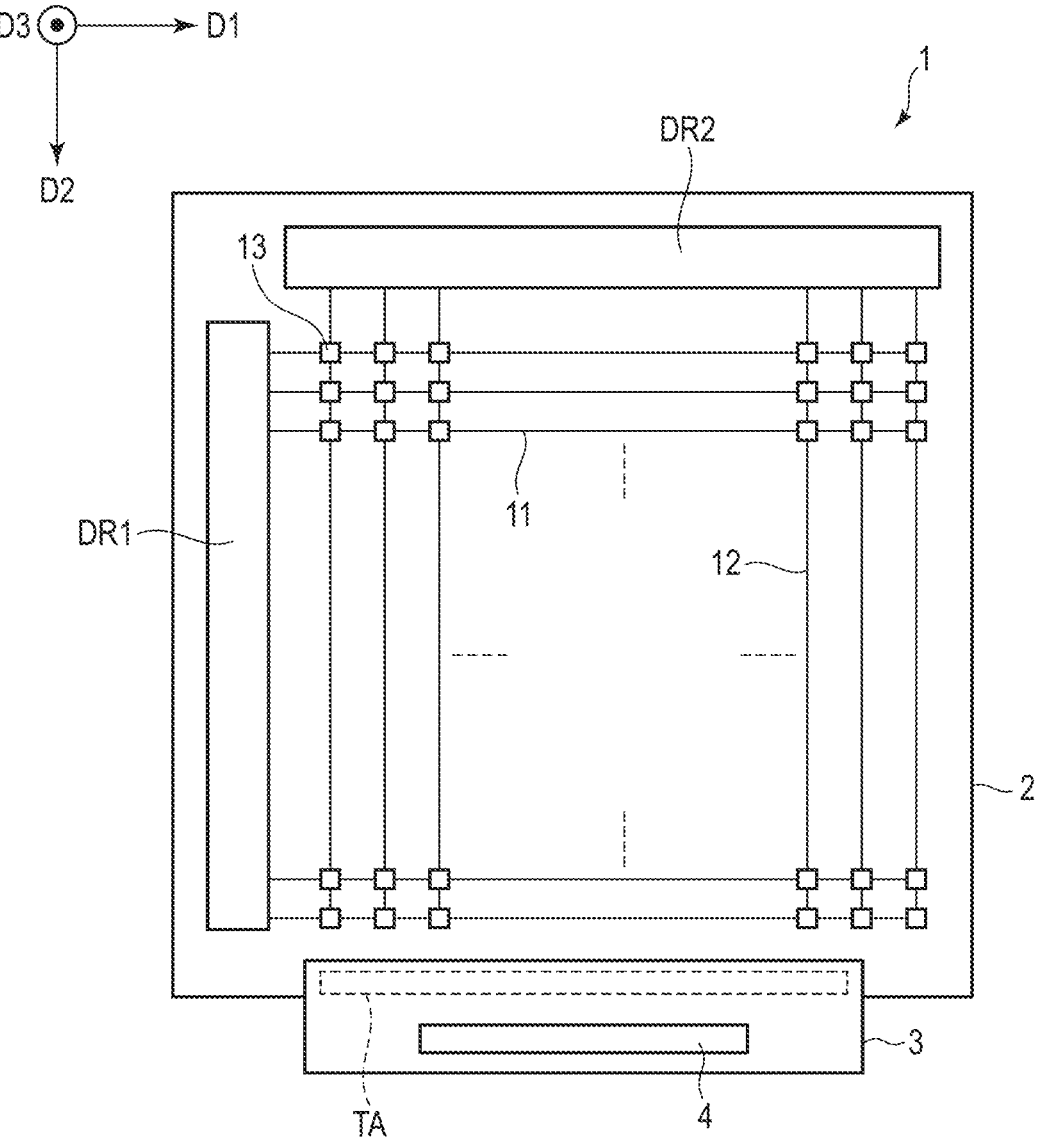
FIG. 1 is a plan view schematically showing an electronic device according to one embodiment.

In general, according to one embodiment, an electronic device comprises an elastic insulating base including a plurality of island-shaped portions and a plurality of strip-like portions each connecting respective adjacent pair of the plurality of island-shaped portions, electrical element located on each of the plurality of island-shaped portions and a plurality of wiring lines located in the plurality of strip-like portions respectively and each electrically connected to the electrical element. Each of the plurality of strip-like portions including a curved portion, and a ratio (R/W) of a radius (R) of curvature in the curved portions to the width W in the curved portion is in a range of 10≤R/W≤20.

According to such configurations, it is possible to provide an electronic device which can improve the reliability when elongated.

Embodiments will be described with reference to the accompanying drawings. Note that the disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a plan view schematically showing an electronic device 1 according to this embodiment. In this embodiment, a first direction D1, a second direction D2 and a third direction D3 are defined as shown in the drawings. The first direction D1 and the second direction D2 are parallel to the main surface of the electronic device 1 and intersect each other. The third direction D3 is perpendicular to the first direction D1 and the second direction D2 and corresponds to the thickness direction of the electronic device 1. The first direction D1 and the second direction D2 intersect perpendicularly in this embodiment, but may intersect at an angle other than perpendicular. In this specification, the direction toward the tip of the arrow indicating the third direction D3 is referred to as "up" and the direction from the tip of the arrow to the opposite direction is referred to as "down". Further, when it is assumed that there is an observation position for observing the electronic device 1 on the tip side of the arrow indicating the third direction D3, viewing a plane D1-D2 defined by the first direction D1 and the second direction D2 from this observation position is referred to as a plan view.

The electronic device 1 includes a flexible substrate 2, a circuit board 3 and a controller 4. The flexible substrate 2 has pliability and elasticity. Specific configuration examples of the flexible substrate 2, which is for achieving elasticity, will be described later.

The flexible substrate 2 comprises a plurality of first wiring lines 11, a plurality of second wiring lines 12, a plurality of electrical elements 13, a first driver DR1 and a second driver DR2. The plurality of first wiring lines 11 and the plurality of second wiring lines 12 are an example of a plurality of wiring lines.

The term "first wiring line 11" is a generic term for a wiring line extending substantially along the first direction D1. The plurality of first wiring lines 11 are aligned along the second direction D2. At least part of the plurality of first wiring lines 11 is electrically connected to the driver 1 DR1.

The term "second wiring line 12" is a generic term for a wiring line extending substantially along the second direction D2. The plurality of second wiring lines 12 are aligned along the first direction D1. At least part of the plurality of second wiring lines 12 is electrically connected to the second driver DR2. The plurality of first wiring lines 11 and the plurality of second wiring lines 12 include multiple types of wiring lines such as scanning lines, signal lines, power lines and various control lines.

The plurality of electrical elements 13 are arranged in a matrix in the flexible substrate 2 along the first direction D1 and the second direction D2. More specifically, the plurality of electrical elements 13 are each located at each respective intersection of the respective one of the first wiring lines 11 and the respective one of the second wiring lines 12, and are electrically connected to the plurality of first wiring lines 11 and the plurality of second wiring lines 12, respectively.

The electrical elements 13 are, for example, sensors, semiconductor elements or actuators. For example, as the sensors, optical sensors that receive visible light or near-infrared light, temperature sensors, pressure sensors touch sensors or the like can be applied. For example, as the semiconductor elements, light emitting element, light receiving elements, diodes, transistors or the like can be applied.

When the electrical elements 13 are light emitting elements, a flexible display with pliability and elasticity can be realized. As the light emitting elements, for example, light emitting diodes or organic electroluminescent elements, which have a size of around 100 μm, such as mini LEDs or micro LEDs can be applied.

When the electrical elements 13 are actuators, for example, piezoelectric elements can be applied. The electrical elements 13 are not limited to those illustrated here, and other elements with various functions can as well be applied. The electrical elements 13 may be capacitors, resistors or the like.

The first driver DR1 and the second driver DR2 are disposed on the flexible board 2, for example, but may as well be arranged on the circuit board 3, the controller 4 or on some other board.

The circuit board 3 is, for example, a flexible printed circuit board, and is electrically connected to each of terminals in a terminal area TA of the flexible board 2. The controller 4 is mounted on the circuit board 3, but may as well be mounted on the flexible board 2.

Figure 2:
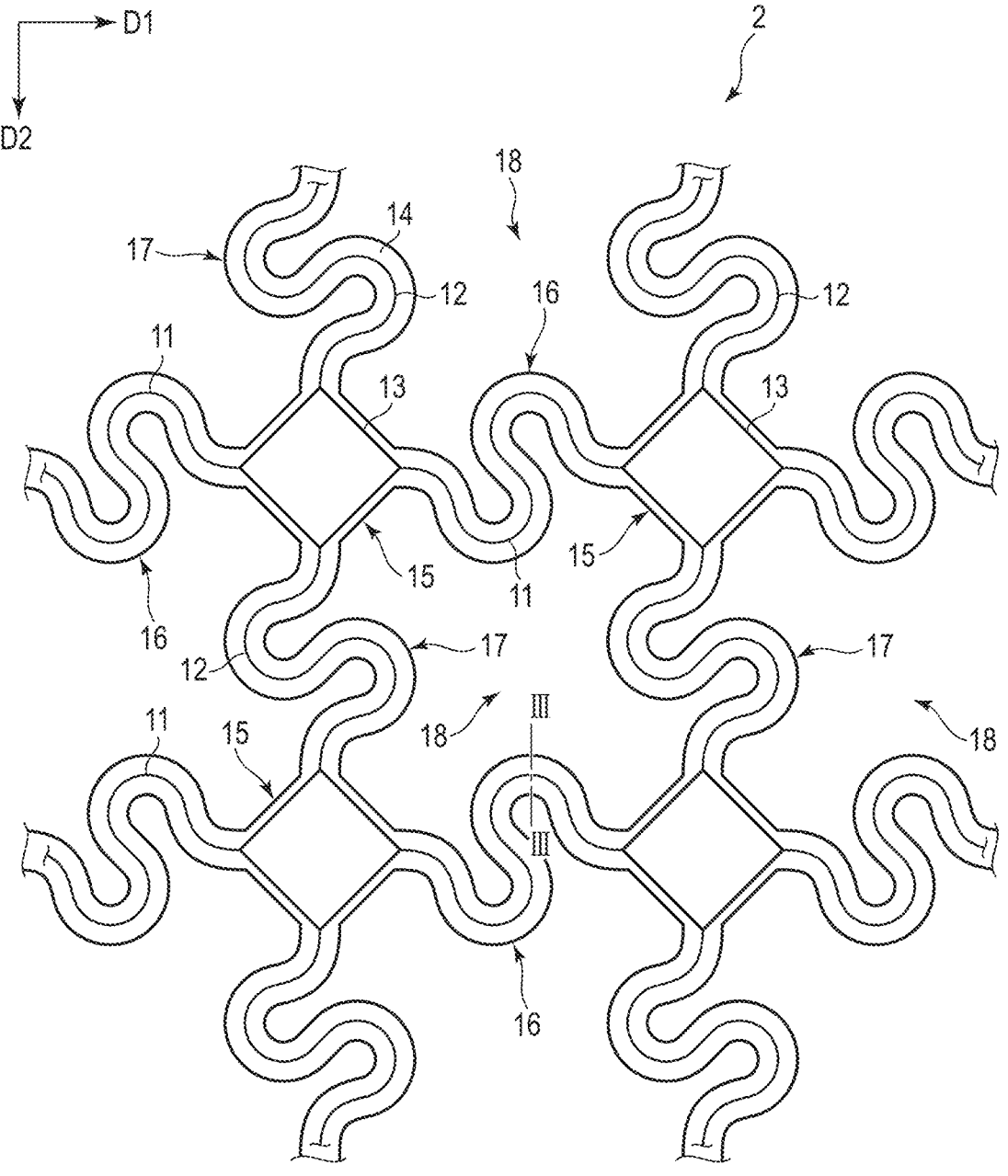
FIG. 2 is a partially enlarged plan view of a flexible substrate shown in FIG. 1.

FIG. 2 is a partially enlarged plan view of the flexible substrate 2 shown in FIG. 1. The flexible substrate 2 further comprises an insulating base 14 that supports the plurality of first wiring lines 11 and the plurality of second wiring lines 12. The insulating base 14 has flexibility and elasticity and can be formed of polyimide, for example, but it is not limited to that of this example.

The insulating base 14 includes a plurality of body portions 15 (island-shaped portions) and a plurality of hinge portions 16 and 17 (strip-shaped portions). The plurality of body portions 15 and the plurality of hinge portions 16 and 17 are formed to be integrated as one body by, for example, patterning a polyimide film thereinto.

The plurality of body portions 15 are arranged in a matrix along the first direction D1 and the second direction D2 so as to be spaced apart from each other. Each of the body portions 15 has a square (rhombic) shape, for example, in plan view. Note that the body portions 15 may as well have other polygonal shapes, or may have circular or elliptical shapes.

The body portions 15 correspond to respective intersections of the hinge portions 16 and the hinge portions 17. The hinge portions 16 and the hinge portions 17 are connected to respective corners of the body portions 15 in the example shown in FIG. 2, but may as well be connected to respective sides of the body portions 15.

The plurality of hinge portions 16 extend substantially along the first direction D1 and are aligned along the second direction D2. The plurality of hinge portions 16 connect the respective body portions 15 adjacent thereto along the first direction D1. The plurality of hinge portions 17 extend substantially along the second direction D2 and are aligned along the first direction D1. The plurality of hinge portions 17 connect adjacent body portions 15 in the second direction D2.

Each of the plurality of hinge portions 16 and 17 is extendable and retractable. The plurality of hinge portions 16 and 17 are each formed in a winding shape (meander shape) in plan view. The plurality of hinge portions 16 and 17 have one or more curved portions.

In the example shown in FIG. 2, each of the hinge portions 16 and 17 is largely curved twice. In other words, each of the hinge portions 16 and 17 has an S-shape. Each of the hinge portions 16 and 17 has an S-shape by including a plurality of curved portions.

The plurality of first wiring lines 11 are located on the respective hinge portions 16. The plurality of first wiring lines 11 extend while overlapping the hinge portions 16, respectively. The plurality of second wiring lines 12 are located on the respective hinge portions 17. The plurality of second wiring lines 12 extend while overlapping the hinge portions 17, respectively. That is, the plurality of first wiring lines 11 have a meander shape similar to the case of the hinge portions 16, and the plurality of second wiring lines 12 have a meander shape similar to the case of the hinge portions 17.

The plurality of first wiring lines 11 and the plurality of second wiring lines 12 are electrically connected to the respective electrical elements 13 through contact holes (not shown) or the like. The plurality of first wiring lines 11 and the plurality of second wiring lines 12 can be formed, for example, of a metal material or a transparent conductive material. The plurality of first wiring lines 11 and the plurality of second wiring lines 12 may have a single-layer structure or a stacked multilayer structure. As the metal material, for example, a stacked layered body of a titanium-based (Ti) material and an aluminum-based (Al) material can be applied.

The electrical elements 13 are located on the respectively body portions 15. The electrical elements 13 are smaller than the body portions 15, for example. The body portions 15 protrude from edges of the respective electrical elements 13 in the example shown in FIG. 2. The position, shape and the like of each electrical element 13 are not limited to those of the example shown in FIG. 2.

The insulating base 14 further comprises a plurality of apertures 18. The plurality of apertures 18 penetrate the insulating base 14. The plurality of apertures 18 are arranged in a matrix. In other words, the insulating base 14 is formed into a mesh-like pattern.

Each aperture 18 is surrounded by respective two hinge portions 16 adjacent to each other along the second direction D2 and respective two hinge portions 17 adjacent to each other along the first direction D1. That is, each hinge portion 17 is located between respective two apertures 18 adjacent to each other along the first direction D1, and each hinge portion 16 is located between respective two apertures 18 adjacent to each other along the second direction D2. The shaped of the apertures 18 are substantially identical to each other.

As described above, the insulating base 14 are composed from a plurality of body portions 15 and a plurality of hinge portions 16 and 17 which connect these body portions 15 to each other, and therefore it is expandable and contractible. When expanding or contractive stress is applied in a particular direction to the insulating base 14, the hinge portions 16 and 17 expand and contract according to the expanding or contractive stress. Thus, the insulating base 14 deforms into a shape according to the expanding or contractive stress.

FIG. 3 is a schematic cross-sectional view of the hinge portion 16 taken along line III-III shown in FIG. 2. FIG. 3 illustrates an example of the cross-sectional structure of the hinge portion 16, but the cross-sectional structure shown in FIG. 3 can as well be applied to the cross-sectional structure of the hinge portion 17.

The flexible substrate 2 further comprises inorganic insulating layers 31 to 34, an organic insulating layer 35 and an elastic member 36. In the example shown in FIG. 3, the first wiring lines 11 each include a wiring line 21 and a wiring line 22. The number of wiring lines included in the first wiring line 11 is not limited that of this example.

The insulating base 14, the inorganic insulating layer 31, the wiring line 21, the inorganic insulating layer 32, the wiring line 22, the inorganic insulating layer 33, the organic insulating layer 35 and the inorganic insulating layer 34 are stacked one on another along the third direction D3 in this order at the hinge portion 16. The thickness of the insulating base 14 is, for example, 5 to 10 µm. The insulating base 14 may, for example, be thicker than the other layers.

The inorganic insulating layer 31 is disposed on the insulating base 14. On the inorganic insulating layer 31, the wiring line 21 is disposed. The width of the wiring line 21 is less than the width of the inorganic insulating layer 31, for example. The wiring line 21 is covered by the inorganic insulating layer 32.

On the inorganic insulating layer 32, the wiring line 22 is disposed. The width of the wiring line 22 is less than the width of the inorganic insulating layer 32, for example. The wiring line 22 is covered by the inorganic insulating layer 33. Between the wiring line 21 and the wiring line 22, the inorganic insulating layer 32 is located.

The organic insulating layer 35 is disposed on the inorganic insulating layer 33. In other words, the organic insulating layer 35 overlaps the wiring lines 21 and 22. The organic insulating layer 35 may as well be referred to as a sealing layer.

The inorganic insulating layer 34 is disposed on the organic insulating layer 35. In other words, the inorganic insulating layer 34 overlaps the organic insulating layer 35. The inorganic insulating layer 34, as one of its functions, inhibits the penetration of moisture and the like toward the organic insulating layer 35 and the first wiring line 11. With this configuration, the reliability of the flexible substrate 2 can be improved.

The insulating base 14, the inorganic insulating layers 31 to 34 and the organic insulating layer 35 are surrounded by the elastic member 36. The elastic member 36 includes a lower portion 361 located below the insulating base 14, an upper portion 362 located above the inorganic insulating layer 34, a first side portion 363 and a second side portion 364.

A lower surface 141 of the insulating base 14 is in contact with the lower portion 361. An upper surface 341 of the inorganic insulating layer 34 is in contact with the upper portion 362. A first side surface 161 of the hinge portion 16 is in contact with the first side portion 363, and a second side surface 162 of the hinge portion 16 is in contact with the second side portion 364. The first side surface 161 and the second side surface 162 are formed by the insulating base 14, the inorganic insulating layers 31 to 34 and the organic insulating layer 35.

The inorganic insulating layers 31 to 34 are formed, for example, of an inorganic insulating material such as silicon oxide (SiO), silicon nitride (SiN) or silicon oxynitride (SiON), but nota that the material is not limited to these.

The organic insulating layer 35 is formed of an organic insulating material such as photosensitive acrylic resin. The elastic member 36 is formed of a transparent resin material that can expand and contract, for example. The elastic member 36 is formed, for example, of a resin having an elastic modulus (Young's modulus) lower than that of the insulating base 14.

Figure 4:
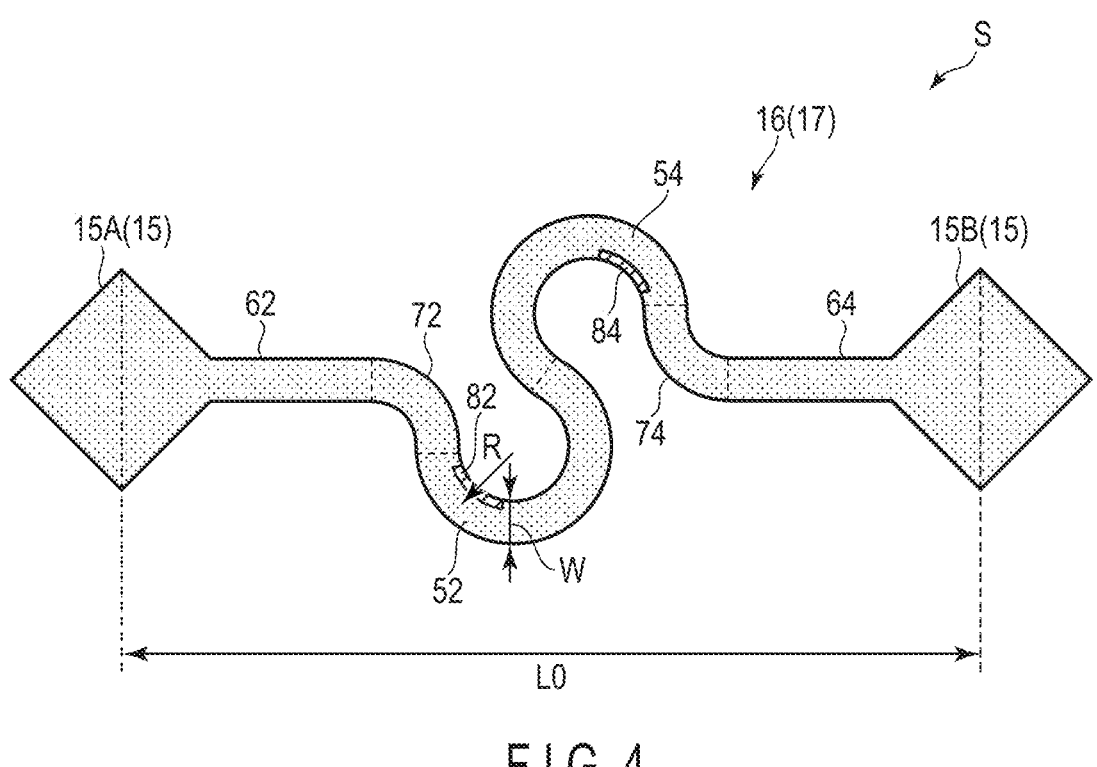
FIG. 4 is a diagram showing a configuration of a sample including the hinge portion.

FIG. 4 shows a configuration of a sample S including the hinge portion 16. Here, the hinge portion 16 will be explained by referring to the sample S, but a similar configuration can be applied to the hinge portion 17.

The sample S includes body portions 15 and a hinge portion 16. In FIG. 4, one of the body portions 15 connected to the hinge portion 16 is illustrated as a body portion 15A and the other as a body portion 15B.

The hinge portion 16 which connects the body portion 15A and the body portion 15B has an S-shape, as described with reference to FIG. 2. Although not illustrated in the drawings, the first wiring line 11 is formed over the body portion 15A, the hinge portion 16 and the body portion 15B. The hinge portion 16 includes curved portions 52 and 54, straight portions 62 and 64 and connecting portions 72 and 74.

The curved portion 52 is connected to the curved portion 54. The hinge portion 16 is formed into an S-shape by the curved portion 52 and the curved portion 54. The straight portion 62 is connected to the body portion 15A. The straight portion 64 is connected to the body portion 15B.

The straight portion 62 is located on the same straight line as the straight portion 64 in the example shown in FIG. 4. The direction in which the straight portion 62 extends is equal to the direction in which the straight portion 64 extends. The connecting portion 72 connects the straight portion 62 to the curved section 52, and the connecting portion 74 connects the straight portion 64 to the curved section 54.

The curved portion 54 has a configuration similar to that of the curved portion 52. The curved portion 54 has a shape that is point symmetrical with the curved portion 52 with respect to the center of the S-shaped meandering portion. The curved portion 54 is curved in a direction different from that of the curved portion 52.

When the sample S is elongated in a direction in which the body portion 15A and the body portion 15B are further away from each other, the tensile stress is most applied to regions 82 and 84 shown in FIG. 4, of the inner circumference portions of the curved portions 52 and 54. Hereafter, the regions 82 and 84 may as well be referred to as stress concentration points.

In the example shown in FIG. 4, the region 82 is located on a body portion 15A side with respect to the center of the entire length along the center line of the curved portion 52. The region 84 is located on a body portion 15B side with respect to the center of the entire length along the center line of the curved portion 54 in the example shown in FIG. 4.

The regions 82 and 84 correspond to regions where the maximum amount of strain occurs when the hinge portion 16 is expanded. In the region where the maximum amount of strain occurs, cracks are likely to be created when the hinge portion 16 is expanded. An example of a crack 100 is shown in FIG. 3.

The crack 100 may occur, for example, from the inorganic insulating layer 34 through the organic insulating layer 35 to the first wiring line 11. The crack 100 may cause the first wiring line 11 to break. In other words, when the hinge portion 16 is expanded, the first wiring line 11 is most likely to break in the vicinity of the regions 82 and 84.

Here, the radius of curvature in the curved portions 52 and 54 is defined as R, and the width of the curved portions 52 and 54 is defined as W. The radius R of curvature is taken at the center of each of the curved portions 52 and 54 (the centerline of each of the curved portions 52 and 54). The radius R of curvature of the curved portions 52 and 54 is, for example, constant. The radius R of curvature is, for example, 15 μm or more.

The width W is constant, for example, in the curved portions 52 and 54, the straight portions 62 and 64 and the connecting portions 72 and 74. The width W is, for example, 5 μm or more, preferably 10 μm or more. Further, note here that the ratio of the radius R of curvature to the width W is defined as a ratio R/W. As the ratio R/W increases, the pitch of the body portion 15A and the body portion 15B increases.

Figure 5:
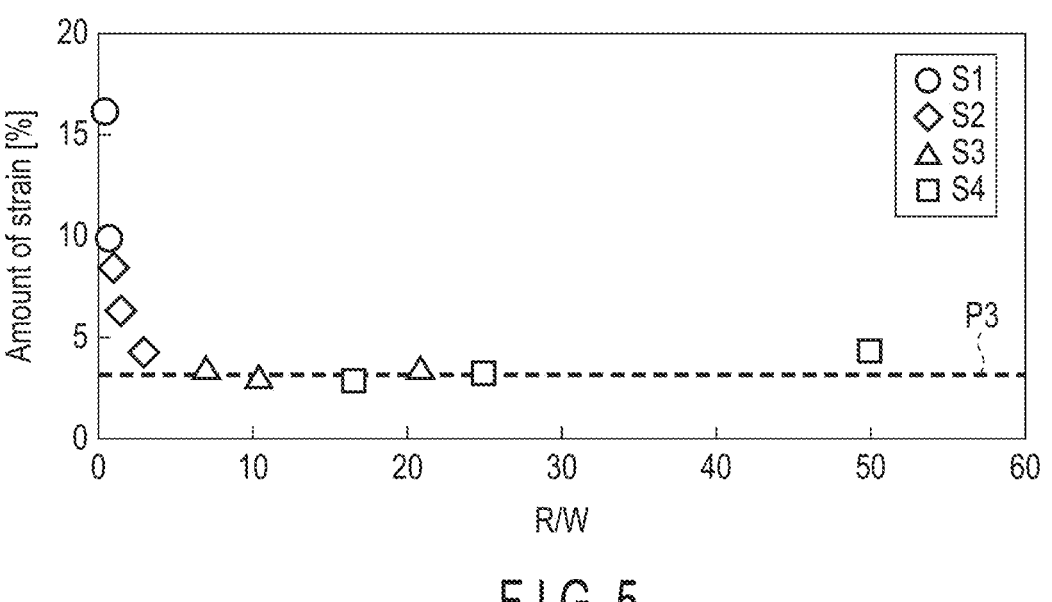
FIG. 5 is a graph showing a result of a simulation of dependency with respect to the ratio R/W of strain at an elongation of 30%.

FIG. 5 is a graph showing the results of a simulation of the dependency of the amount of strain on the ratio R/W at an expansion rate of 30%. In this simulation, calculated were the amount of strain in the region 82 of the curved portion 52 in the case where the hinge portion 16 was expanded in a direction in which the body portion 15A and the body portion 15B shown in FIG. 4 are further away from each other.

First, the expansion rate will be explained. Let us define the straight line distance from the center of the body portion 15A to the center of the body portion 15B (or the pitch of the body portion 15A and the body portion 15B) as a distance L0 (shown in FIG. 4).

The linear distance from the center of the body portion 15A to the center of the body portion 15B (or the pitch of the body portion 15A and the body portion 15B) when the hinge portion 16 is expanded in the direction in which the body portion 15A and the body portion 15B are further away from each other (in the direction that increases the distance L0) is defined as a distance L1. Here, the expansion rate is calculated by dividing the increment (L1−L0) in distance by the distance L0 and multiplying by 100. An expansion rate of 30% corresponds to the state that the hinge portion 16 is expanded to a distance L1, which is 1.3 times the distance L0, by the application of tensile stress.

Next, the amount of strain will be explained. The amount of strain is indicated as follows. That is, when the expansion rate is 0% (that is, when no tensile stress is applied to the curved portion 52), the degree of strain is 0%. The amount of strain indicates the degree of strain in the region 82 when the expansion rate is 30% (the tensile stress is applied to the curved portion 52). It is known here that as the amount of strain is larger, the more likely it is that the hinge portion 16 including the first wiring line 11 will be broken.

FIG. 5 shows the results of simulations for the first to fourth samples S1 to S4.

The radius R of curvature of the first sample S1 is 15 μm, that of the second sample S2 is 30 μm, that of the third sample S3 is 210 μm, and that of the fourth sample S4 is 500 μm.

As for the first sample S1, the width W was varied in two ways: 30 μm (R/W=0.5) and 20 μm (R/W=0.75).

As for the second sample S2, the width W was varied in three ways: 30 μm (R/W=1.0), 20 μm (R/W=1.5) and 10 μm (R/W=3.0).

As for the third sample S3, the width W was varied in three ways: 30 μm (R/W=7.0), 20 μm (R/W=10.5) and 10 μm (R/W=21.0).

As for the fourth sample S4, the width W was varied in three ways: 30 μm (R/W≈16.7), 20 μm (R/W=25.0) and 10 μm (R/W=50.0).

From the graph shown in FIG. 5, it is confirmed that in the range where the ratio R/W is smaller than 10, the amount of strain tends to decrease as the ratio R/W increased, whereas the amount of strain tends to increase as the ratio R/W increases in the range where the ratio R/W was larger than 20. Further, it is confirmed that the amount of strain is at the minimum when the ratio R/W is around 15. As confirmed above, it is preferable for the ratio R/W to be 10≤R/W≤20, and more preferable for the ratio R/W to be 13≤R/W≤17. The ratio R/W is even more preferable if it is 15.

The ratio R/W may be adjusted by reducing the width W relative to the radius R of curvature, by increasing the radius R of curvature relative to the width W, or by reducing the width W and increasing the radius R of curvature.

By adjusting the ratio R/W to such a range or value as described above, the amount of strain is suppressed and breaking of the hinge portion 16 is less likely to occur. In other words, by adjusting the ratio R/W to a range or value as described above, it is possible to realize a hinge portion 16 having a configuration that is difficult to rupture even when tensile stress is applied to the stress concentration point. By adjusting the ratio R/W to the range or value as described above, the hinge portion 16 becomes easier to deform (easier to move).

FIG. 5 shows, as one example, a fracture strain of the inorganic insulating layer 34 formed of silicon nitride (SiN) by a line P3. The fracture strain corresponds to the amount of strain that may cause cracks in the inorganic insulating layer when it is expanded. In the case of the line P3, the amount of strain is 3%.

The amount of strain in the curved portion 52 should preferably be smaller than the fracture strain of the inorganic insulating layer 34. When the ratio R/W is 10≤R/W≤20, the amount of strain can be made smaller than a rupture strain of 3% in the inorganic insulating layer 34. In other words, the amount of strain of the ratio R/W where 10≤R/W≤20 is located below the line P3.

That is, as described above, by adjusting the ratio R/W to the range or value as described above, the amount of strain of the curved portion 52 in the case of a 30% expansion rate is located below the line P3, and thus it is possible to achieve an expansion rate of 30% in the hinge portion 16.

Although not shown in the figure, it has been confirmed by simulations that profiles similar to those of the graph shown in FIG. 5 are obtained for other expansion rates (for example, 10% and 20%). In other words, the dependency of the amount of strain on the ratio R/W at each of other expansion rates is similar to that of the case where the expansion rate is at 30%.

That is, in the range where the ratio R/W is less than 10, the amount of strain tends to become smaller as the ratio R/W increases, whereas in the range where the ratio R/W is greater than 20, the amount of strain tends to become larger as the ratio R/W increases. Note that the amount of strain is at the minimum when the ratio R/W is around 15.

By adjusting the ratio R/W to the range or value described above, the amount of strain of the hinge portion 16 is suppressed, and thus the hinge portion 16 including the first wiring line 11 is less likely to break when the hinge portion 16 is expanded.

From the results provided above, it has been confirmed that the amount of strain of the hinge portion 16 can be controlled by the ratio R/W of the radius R of curvature to the width W. Note, although a technique for controlling the amount of strain of the hinge portion 16 is described here, the amount of strain of the hinge portion 17 can also be controlled by a similar technique.

As described above, according to this embodiment, it is possible to provide an electronic device 1 with an improved reliability even when expanded. More precisely, by adjusting the ratio R/W in the hinge portions 16 and 17, the hinge portions 16 and 17 of the electronic device 1 are less likely to be broken when expanded as described with reference to FIGS. 4 and 5. As a result, an electronic device 1 with an improved reliability can be provided.

In this embodiment, the radius R of curvature and the width W in each of the hinge portions 16 and 17 are adjusted so that the ratio R/W of the radius R of curvature to the width W is 10≤R/W≤20. More preferably, the radius R of curvature and the width W in each of the hinge portions 16 and 17 are adjusted so that the ratio R/W is 13≤R/W≤17. With this configuration, the amount of strain can be further reduced.

Even more preferably, the radius R of curvature and the width W in each of the hinge portions 16 and 17 are adjusted so that the ratio R/W is 15. By adjusting the ratio R/W to a range of 10≤R/W≤20 in the curved portions 52 and 54, the hinge portions 16 are 17 are less likely to be broken even if the expansion rate is at 30%, as described with reference to FIG. 5.

In this embodiment, the entire curved portions 52 and 54 are formed so that the ratio of the radius of curvature to the width satisfies the range or value specified above, but the curved portions 52 and 54 may as well be formed so that the ratio of the width to the radius of curvature satisfies the above-specified range or value at least in the zones including the regions 82 and 84 (the stress concentration points).

In this embodiment, for example, one electrical element 13 is arranged in one body portion 15, but a plurality of electrical elements 13 may be arranged in one body portion 15.

In this embodiment, the hinge portions 16 and 17 are curved twice, but various shapes may as well be applied to the hinge portions 16, 17, for example, a shape that is curved once, a shape that is curved three or more times, etc. Further, the shape of the hinge portion 16 may be different from that of the hinge portion 17.

In this embodiment, the hinge portion 16 includes straight sections 62 and 64, but the hinge portion 16 may not include straight sections 62, 64, or may include only one of the straight sections 62 and 64.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
an elastic insulating base including a plurality of island-shaped portions and a plurality of strip-like portions each connecting respective adjacent pair of the plurality of island-shaped portions;
an electrical element located on each of the plurality of island-shaped portions;

a plurality of wiring lines located in the plurality of strip-like portions respectively and each electrically connected to the electrical element; and
an elastic member which surrounds the insulating base and the plurality of wiring lines in the strip-like portions,
wherein
each of the plurality of strip-like portions includes a curved portion,
a ratio (R/W) of a radius (R) of curvature in the curved portions to the width W in the curved portion is in a range of 10≤R/W≤20, and
an elastic modulus of the elastic member is lower than an elastic modulus of the insulating base.

2. An electronic device comprising:
an elastic insulating base including a plurality of island-shaped portions and a plurality of strip-like portions each connecting respective adjacent pair of the plurality of island-shaped portions;
an electrical element located on each of the plurality of island-shaped portions; and
a plurality of wiring lines located in the plurality of strip-like portions respectively and each electrically connected to the electrical element,
wherein
each of the plurality of strip-like portions includes a curved portion,
a ratio (R/W) of a radius (R) of curvature in the curved portions to the width W in the curved portion is in a range of 10≤R/W≤20,
the curved portion includes a first curved portion and a second curved portion connected to the first curved portion, and
a radius of curvature in the first curved portion is equal to a radius of curvature in the second curved portion.

3. An electronic device comprising:
an elastic insulating base including a plurality of island-shaped portions and a plurality of strip-like portions each connecting respective adjacent pair of the plurality of island-shaped portions;
an electrical element located on each of the plurality of island-shaped portions; and
a plurality of wiring lines located in the plurality of strip-like portions respectively and each electrically connected to the electrical element,
wherein
each of the plurality of strip-like portions includes a curved portion,
a ratio (R/W) of a radius (R) of curvature in the curved portions to the width W in the curved portion is in a range of 10≤R/W≤20,
the plurality of strip-like portions each further comprises a straight portion connected to a respective one of the plurality of island-shaped portions, and
a width in the straight portion is equal to a width in the curved portion.

* * * * *